(12) United States Patent
Schliesser et al.

(10) Patent No.: US 11,486,756 B2
(45) Date of Patent: Nov. 1, 2022

(54) MECHANICAL RESONATOR DEVICE

(71) Applicant: Albert Schliesser, Copenhagen V (DK)

(72) Inventors: Albert Schliesser, Copenhagen V (DK); Yeghishe Tsaturyan, Nærum (DK); Eugene Simon Polzik, Copenhagen Ø (DK); Andreas Barg, Copenhagen NV (DK)

(73) Assignee: UNIVERSITY OF COPENHAGEN, Copenhagen K (DK)

(*) Notice: Subject to any disclaimer, the term of this patent is extended or adjusted under 35 U.S.C. 154(b) by 327 days.

(21) Appl. No.: 16/322,645

(22) PCT Filed: Aug. 1, 2017

(86) PCT No.: PCT/EP2017/069402
§ 371 (c)(1),
(2) Date: Feb. 1, 2019

(87) PCT Pub. No.: WO2018/024713
PCT Pub. Date: Feb. 8, 2018

(65) Prior Publication Data
US 2021/0381877 A1    Dec. 9, 2021

Related U.S. Application Data

(60) Provisional application No. 62/369,383, filed on Aug. 1, 2016.

(51) Int. Cl.
*G01G 3/16* (2006.01)
*G01L 1/10* (2006.01)

(52) U.S. Cl.
CPC .............. *G01G 3/165* (2013.01); *G01L 1/106* (2013.01)

(58) Field of Classification Search
CPC ................................ G01L 1/106; G01G 3/165
See application file for complete search history.

(56) References Cited

U.S. PATENT DOCUMENTS 8,054,145 B2    11/2011    Mohammadi

OTHER PUBLICATIONS

Yu, P.L. et al., "A phononic bandgap shield for high-$Q$ membrane microresonators," Applied Physics Letters, vol. 104, issue 2, Jan. 13, 2014 (Jan. 13, 2014), pp. 23510-1-23510-4, DOI: 1063/1.4862031.

(Continued)

*Primary Examiner* — Paul M. West
(74) *Attorney, Agent, or Firm* — Nixon Peabody LLP

(57) ABSTRACT

A mechanical resonator device. The resonator device includes a resonator element made of an elastic material under tensile stress and adapted for sustaining at least one oscillation mode; and a clamping structure supporting the resonator element. The clamping structure has a phononic density of states exhibiting a bandgap or quasi-bandgap such that elastic waves of at least one polarisation and/or frequency are not allowed to propagate through the clamping structure. The resonator element and the clamping structure are configured to match with a soft-clamping condition that elastic waves of polarisation and/or frequency corresponding to the at least one oscillation mode of the resonator penetrate evanescently into the clamping structure in a manner such as to minimize bending throughout the entire resonator device. Thereby, bending related loss may be minimized and the Q-factor of the mechanical resonator may be maximized.

18 Claims, 7 Drawing Sheets

(56) References Cited

OTHER PUBLICATIONS

Mohammadi et al., "Waveguide-Based Phononic Crystal/Micro/Nanomechanical High-$Q$ Resonators," Journal of Microelectromechanical Systems, IEEE Service Center, US, vol. 21, No. 2, Apr. 1, 2012 (Apr. 1, 2012), pp. 379-384, XP011440481, ISSN: 1057-7157, DOI: 10/1109/JMEMS.2011.2174426.

Hsu et al., "Reducing Support Loss in Micromechanical Ring Resonators Using Phononic Band-Gap Structures," Journal of Physics D: Applied Physics, Institute of Physics Publishing Ltd, GB, vol. 44, No. 37, Aug. 26, 2011 (Aug. 26, 2011), p. 375101, XP020210519, ISSN: 0022-3727, DOI: 10.1088/0022-3727/44/37/375101.

Feng et al., "The Investigation of Point Defect Modes of Phononic Crystal for High Q Resonance," Journal of Applied Physics, American Institute of Physics, US, vol. 109, No. 12, Jun. 24, 2011 (Jun. 24, 2011), pp. 124907-124907, XP012147292, ISSN: 0021-8979, DOI: 10.1063/1.3599866.

Pennec et al., "Fundamental Properties of Phononic Crystal," In: "Phononic Crystals," Jan. 1, 2016 (Jan. 1, 2016), Springer New York, New York, NY, XP055418084, ISBN: 978-1-4614-9393-8 pp. 23-50, DOI: 10.1007/978-1-4614-9393-8_2.

Ghadimi et al., "Dissipation Engineering of High-Stress Silicon Nitride Nanobeams," [Online] Mar. 4, 2016 (Mar. 4, 2016), XP002774958, https://arxiv.org/abs/1603.01605 Retrieved from the Internet: URL:https://arxiv.org/abs/1603.01605 [retrieved on Oct. 20, 2017].

Yu et al., "Control of Material Damping in High-Q Membrane Microresonators," Physical Review Letters, vol. 108, Feb. 23, 2012 (Feb. 23, 2012), p. 083603, XP002774959.

International Search Report in International Patent Application No. PCT/EP2017/069402, dated Nov. 17, 2017 (5 pages).

Written Opinion in International Patent Application No. PCT/EP2017/069402, dated Nov. 17, 2017 (9 pages).

— x (orange)
— y (red)

MECHANICAL RESONATOR DEVICE

CROSS-REFERENCE TO RELATED APPLICATIONS

This application is a U.S. National Stage of International Application No. PCT/EP2017/069402, filed Aug. 1, 2017, which claims the benefit of U.S. Provisional Application No. 62/369,383, filed Aug. 1, 2016, both of which are incorporated herein by reference in their entireties.

TECHNICAL FIELD

The present invention relates in one aspect to a mechanical resonator device, the device comprising a resonator element and a clamping structure supporting the resonator element. In a further aspect, the invention relates to a method of providing a mechanical resonator device with a resonator element and a clamping structure suspending the resonator element. In a yet further aspect the invention relates to a sensor comprising such a mechanical resonator device.

BACKGROUND OF THE INVENTION

Nanomechanical resonators offer exquisite sensitivity in the measurement of mass and force. This has enabled dramatic progress in several frontier fields of contemporary physics, such as the detection of individual biomolecules, spins, and mechanical measurements of quantum vacuum fields. Essentially, this capability originates from the combination of two features: first, a low mass m, so that small external perturbations induce relatively large changes in the motional dynamics. Second, high coherence, quantified by the quality factor Q, implying that random fluctuations masking the effect of the perturbation are small. In practice, a heuristic $Q \propto m^{1/3}$ rule, likely linked to surface losses, often forces a compromise, however.

A notable exception to this rule has been reported recently, in the form of highly stressed silicon nitride string and membrane resonators, achieving $Q \sim 10^6$ at MHz-resonance frequencies f, and nanogram (ng) effective masses $m_{eff}$. By now it is understood that the pre-stress $\sigma$ "dilutes" the dissipation intrinsic to the material (or its surfaces), a feat known and applied also in the mirror suspensions of gravitational wave antennae. The resulting exceptional coherence has enabled several landmark demonstrations of quantum effects with nanomechanical resonators already at moderate cryogenic temperatures. However, systematic investigations of such silicon nitride resonators have identified an upper limit for the product $Q \cdot f < 6 \times 10^{12}$ Hz$\approx k_B T_R/(2\pi\hbar)$ for the low-mass fundamental modes, insufficient for quantum experiments at room temperature $T_R$. Better Q f-products have been reported in high-order modes of large resonators, but come at the price of significantly increased mass and intractably dense mode spectrum.

Ghadimi et al., arXiv:1603.01605, 2016, describe a further approach of engineering the dissipation of nano-beams made of stressed silicon nitride thin films, where a nano-beam is embedded in a one-dimensional phononic crystal. The one-dimensional phononic crystal is formed as a string of planar, box-shaped elements, which are periodically arranged and connected by narrow bridges. The nano-beam is formed as a defect in the periodic structure of the one-dimensional phononic crystal. The one-dimensional phononic crystal structure and the defect are patterned into a highly stressed silicon nitride thin film. The device is designed for in-plane oscillation parallel to the plane of the supporting substrate. The in-plane displacement is transduced by means of a micro-cavity-based near-field sensor. The device performance and design is discussed in the light of a computer simulation of the motion pattern. However, the resonator design according to Ghadimi has inherent dissipation limitations. As a consequence, the resonator design according to Ghadimi still fails to achieve a Q*f product above 10^13 Hz. Therefore, there is a need for further improvements when designing mechanical resonators for high Q-factors.

SUMMARY OF THE INVENTION

The present invention relates to a mechanical resonator for detecting weak forces or masses, and other physical entities that can be translated into a force or mass acting on the resonator. To this end, the resonator is exposed to the force or mass exerted by a sample. Then a change in the motional dynamics of the nanomechanical resonator is observed. Since the nanomechanical resonator possesses a low mass, this change can be relatively large, and correspondingly small forces and masses can be detected.

If the resonator, the sample exerting the force, or another element influencing the sample and the resonator (such as a magnet) are raster-scanned in space, it is, in addition, possible to record spatial maps of the force, which allows imaging of the sample's properties. It is also possible to monitor several of the mechanical motional modes simultaneously. From the changes in motional dynamics induced in the different modes it is also possible to draw conclusions on the spatial distribution (moments) of the force or mass distribution acting on the nanomechanical sensor.

There are many practical applications of the mechanical force sensors described above. They include, in particular, atomic force microscopy and magnetic resonance force microscopy. While the former is sensitive to surface forces, such as the van-der-Waals force, the latter can sense the presence and polarisation of electronic and nuclear spins. This is of high interest in chemical and biological imaging, but also in fundamental studies.

The mechanical resonator can also be exposed to a stream of particles, some of which deposit on the resonator. If desired, chemical or biological functionalization of the resonator can favour the binding of specific target molecules, such as proteins, on the resonator surface. The amount of deposited mass can again be tracked as a change in motional dynamics. These techniques enable sensitive mass detection, down to the single molecule level, mass spectrometry, and inertial imaging of mass distributions of known and unknown target molecules. It is also possible to selectively excite desorbed molecules with an optical or infrared laser beam. Light-absorption induced heating of the molecule then shifts the mechanical resonator's size and therefore motional dynamics. Using these techniques, characteristic absorption signatures of trace amounts of molecules can be detected.

By functionalising the mechanical resonator with plasmonic nanostructures, interaction of light and target molecules can be further enhanced, increasing the sensitivity in the methods described above. Plasmonic nanostructures can also be employed to detect the nanomechanical motion.

Furthermore, the mechanical resonators can be functionalised to couple to electromagnetic fields, including radio-frequency, microwave and optical frequencies. For example, membrane mechanical resonators can be metallised to constitute an electrode of a mechanically compliant capacitor. Then, a voltage applied to the capacitor induces motion of the membrane. Using an optical interferometer, the voltage can be optically measured, with high sensitivity. In the same manner, electronic signals can be converted, first to mechanical motion, and then to optical signals, which can be transported via optical fibre. If arranged properly, optical signals can also be converted, in reverse, to electronic signals. The ensuing bidirectional conversion can be very efficient, and is of interest, for example, to transport quantum electronic signals such as those generated by circuit-QED systems.

Mechanical resonators can also be arranged to respond sensitively to vacuum forces of the electromagnetic field, in particular when coupled to a microwave or optical cavity. Using techniques developed in the field in cavity optomechanics, it is then possible to modify the quantum fluctuations of the electromagnetic field. In particular, it is possible to generate states with reduced fluctuations, such as squeezed and entangled fields of light and microwaves, and to generate entanglement between different microwave, optical and mechanical modes.

In all of the applications described above, it is desirable that the mechanical resonator has a low mass m so that its motional dynamics are strongly affected by a small added mass or force. On the other hand, it is essential that the motional dynamics are not strongly perturbed by thermomechanical noise. Thermomechanical noise arises from the coupling of the resonator to a thermal reservoir at temperature T, and can be described as a "Langevin" force noise with a power spectral density of $S_{FF}=2m\ \Gamma_m k_B\ T$, where m is the resonator mass, $\Gamma_m$ its dissipation rate and $k_B$ the Boltzmann constant. In order to prevent thermomechanical noise from masking the (force, mass) signals of interest, it has to be minimised.

In many of the applications described above, it is therefore necessary to reduce the environment temperature T, for example by cooling the resonator cryogenically. In some applications, it is sufficient to cool to liquid nitrogen (T=77K) or helium temperature (T=4.2K), in others it is necessary to use dilution refrigerators to reach T=1 K and lower. Cryogenic cooling is necessarily accompanied with increased technical complexity, reduced access to the sample, and long sample turnover times. In general, complexity, as well as one-time and running cost of the above described measurement increases, the lower the operation temperature has to be. It is therefore highly desirable to reach the same sensitivity—that is, equally low Langevin force noise—at higher temperatures. Furthermore, some applications, such as some types of biological mass sensing can only be done room temperature. In these cases, the Langevin force noise sets a sensitivity limit, which can only be improved by reducing either mass or dissipation.

Lastly, in some application it may be desirable to use resonator materials whose mechanical properties are not good. For example, polymers are easy to fabricate and low-cost. In this case, it is desirable to implement resonators with moderately low dissipation, by employing a mechanism that dilutes the intrinsic dissipation of the material.

It is therefore the object of the invention to provide mechanical resonators that possess a dissipation that is as low as possible.

According to one aspect, the object of the invention is achieved by a mechanical resonator device comprising a resonator element and a clamping structure supporting the resonator element according to independent claim 1, with advantageous embodiments as defined in the corresponding dependent claims. According to a further aspect, the object of the invention is achieved by a method of providing a mechanical resonator device according to the present disclosure. According to a specific aspect, a sensor device comprises a resonator device according to any of the embodiments disclosed herein, and a read-out device, as disclosed herein.

By allowing for an evanescent penetration of elastic waves corresponding to the oscillator mode sustained by the resonator element into the clamping structure, so as to provide soft-clamping of the resonator element, unprecedented Q-factors may be achieved.

The evanescent penetration may be described as exponential decay of the amplitude of the elastic waves corresponding to the oscillation mode of the resonator element and may be characterized by a characteristic 1/e-decay length. Evanescent penetration occurs within the bandgap or quasi-bandgap of the clamping structure. As already mentioned above, Ghadimi provides a resonator device designed for in-plane oscillation parallel to the plane of the supporting substrate with a nano-beam that is embedded in a one-dimensional phononic crystal. However, as evident from FIG. 4 and equation 1 in Ghadimi, the resonator design according to Ghadimi has inherent dissipation limitations corresponding to those of an ideal nanobeam clamped in an infinitely rigid clamping structure, discussed in detail, for example, in Unterreithmeier et al., Physical Review Letters 105:27205 (2010), and in Yu et al., Physical Review Letters 108:083603 (2012).

One particularly important merit of the present invention resides in the insight that the rigid clamping limit can be overcome by providing soft-clamping, which is achieved by allowing for an adequate evanescent penetration of the oscillation mode of the resonator element into the clamping structure, and engineering that evanescent penetration to optimize the Q-factor. As further discussed below, this works particularly well for out-of-plane oscillations and/or a two dimensional clamping geometry, not the least due to synergetic additional advantages residing in the well-controlled fabrication of such devices using conventional surface micromachining techniques.

A further important merit of the present invention resides in the insight that the evanescent penetration facilitates mode shape engineering allowing for improved soft-clamping for optimizing the Q-factor, in particular by configuring the resonator device in such a manner that the oscillation mode exhibits an energy-normalised, integrated curvature that is lower than that of a reference resonator that is rigidly clamped in a conventional manner, such as a plain membrane or a string of the same frequency. The energy-normalized mode shape curvature integral for said oscillation mode of the resonator device is thus lower as compared to an energy-normalized mode shape curvature integral for a corresponding mode with the same frequency of a reference resonator directly suspended from fixed anchoring means on a substrate.

According to a particularly advantageous embodiment an energy-normalized mode shape curvature integral for the oscillation mode of the resonator device is less than an energy-normalized mode shape curvature integral for a corresponding mode with the same frequency of a reference resonator directly suspended from fixed anchoring means on a substrate.

The reference resonator is rigidly clamped in a conventional manner, without the intermediate of a clamping structure providing soft-clamping. The reference resonator without the soft-clamping as achieved by the clamping structure is typically formed as a simple micro- or nanoscale element. The limitation to a "corresponding mode" implies that the reference resonator is suspended from fixed anchoring means on a substrate in the same manner as the clamping structure of the resonator device. The limitation to a "corresponding mode" further implies that the reference resonator without soft-clamping is shaped to reflect the geometry of the resonator device: In the case of a two-dimensional clamping structure supporting the resonator element in a two-dimensional geometry, the relevant reference resonator is shaped as a membrane, i.e. a plane-parallel, thin slab made of the same elastic material as the resonator element; in the case of a one-dimensional clamping structure supporting the resonator element in a one-dimensional geometry, the relevant reference resonator is shaped as a uniform string, also referred to as a beam, made of the same elastic material as the resonator element, and under the same average tensile stress. The average is the spatial average over the entire device, i.e. the resonator device and the reference resonator as applicable. The spatial average is determined as the spatial integral over the local stress for the entire length/surface of the relevant device, divided by the total length/surface area of the device.

The oscillation mode of the resonator device has a mode shape with a location dependent oscillation mode curvature; an integral of the squared curvature over all locations on the resonator device defines a mode shape curvature integral for the oscillation mode of the resonator device. A corresponding reference resonator has a corresponding mode shape with a location dependent curvature; an integral of the squared curvature over all locations on the reference resonator defines an energy-normalized mode shape curvature integral for the corresponding mode. The mode shape curvature integrals are thus determined disregarding the sign of the curvature in each location.

The term "energy-normalized" refers here to normalization with respect to the energy stored in said oscillation mode and corresponding mode, respectively. The mode shape curvature integrals are determined by integrating the curvatures of the mode shape over the entire device suspended from a fixed substrate, i.e. the entire resonator device, or the entire plain membrane or simple string taken for reference, as applicable.

The resonator element and the clamping structure are thus configured to match with a soft-clamping condition that elastic waves of polarisation and/or frequency corresponding to the at least one oscillation mode of the resonator penetrate evanescently into the clamping structure in a manner such as to minimize bending throughout the entire device. Thereby, bending related loss may be minimized and the Q-factor of the mechanical resonator may be maximized.

According to some embodiments, configuring the resonator element and/or the clamping structure is advantageously done by optimizing a topology of a lateral pattern defining the resonator element and/or the clamping structure;

According to some embodiments of the invention, such resonators are obtained by realising shielded oscillation modes in an elastic material under tensile stress. In particular, according to some embodiments, the invention employs periodic structuring of two-dimensional membrane and string resonators under high tensile stress to shield localised oscillation modes. The resonator structure is thin in the (arbitrarily defined) z-dimension, with a thickness h that is much smaller than the characteristic size in at least one of the two dimensions x,y. That is, it assumes a string- or membrane-type shape. As elastic material, the resonator supports a number of oscillation modes.

According to some embodiments of the invention, the resonator is supported by a clamp in which elastic waves of at least one polarisation and frequency are not allowed to propagate. At the same time, the clamp does not impose a boundary condition on the allowed oscillation modes of the resonator, which enforce a strong curvature in the clamping region of the resonator mode. This is accomplished by a clamping structure, into which elastic waves of polarisation and frequency similar to the said polarisation and frequency of the resonator's oscillation modes can penetrate evanescently. In an advantageous embodiment, this is realised by a clamp whose phononic density of states exhibits a bandgap or quasi-bandgap, so that waves of said resonator frequency or polarisation can penetrate evanescently into this clamp. In an advantageous embodiment, the bandgap or quasi-bandgap in the clamp is realised by periodic patterning of the clamp. In an advantageous embodiment, the said clamp is made from the same elastic material as the resonator, and is also under high tensile stress.

According to some embodiments of the invention, the reduced curvature by this "soft", or evanescent clamping, reduces the per-cycle dissipation, as compared to the energy stored in the resonator, which is dominated by the tensile stress. In this manner, higher quality factors can be achieved than in resonators that are clamped in a different manner. Advantageously, the bandgap or quasi-bandgap in the clamp also suppresses phonon tunneling from and to the substrate to the shielded oscillation mode, so that dissipation by radiation of elastic waves is also suppressed.

According to some embodiments of the invention, low mass resonators can be realised if the decay length of the evanescent wave is relatively short, that is, in the range of 0.1 to 20 times the wavelength of elastic waves in the clamp.

In an exemplary embodiment further discussed in detail below, the resonator and clamp are realised in a 65 nm-thick stressed silicon nitride membrane with an initial stress of 1.27 GPa. A honeycomb pattern of circular holes is etched (FIG. 1a, see below) into this membrane, with a lattice constant of a=160 µm and hole radius r=0.26 a. A shielded oscillation mode is created in the centre of the membrane by perturbing the otherwise regular hole pattern (FIG. 1b, see below).

Further according to some embodiments, the resonator assumes the form of a string, ribbon, or a trampoline, that is, a central pad held by a number of strings or ribbons from the side.

Further according to some embodiments, the resonator thickness h assumes values ranging from 0.1 nm to 10 µm.

Further according to some embodiments, the lattice constant a assumes values between 1 µm and 10 mm.

Further according to some embodiments, the hole size assumes values between 0.10 and 0.90 a.

Further according to some embodiments, the holes have the shape of an ellipse, polygon, or any other shape.

Further according to some embodiments, the periodic pattern has a square, or a hexagonal symmetry.

Further according to some embodiments, the periodic pattern consists in protrusions, thickness modulation, added materials, or other means to periodically modify the speed of sound.

Further according to some embodiments, shielded oscillation modes are realised in elastic materials such as diamond, quartz, aluminium nitride, silicon carbide, gallium arsenide, indium gallium arsenide, aluminium gallium arsenide, aluminium, gold, graphene, polymer materials or combinations thereof. More generally, other embodiments could be realised in dielectrics, metals, semiconductors, metal di-chalcogenides, ceramics or piezoelectric materials, or combinations thereof.

Further according to some embodiments, the periodic pattern has a square or hexagonal symmetry.

Further according to some embodiments, the initial stress assumes a value between 10 M Pa to 50 GPa.

Further according to some embodiments, a number of oscillation modes are realised in different parts of the membrane or string, by introducing more than one defect in the periodic pattern. These different oscillation modes can then be coupled linearly and nonlinearly (e.g. depending on the oscillation amplitude), which allows more complex sensing and transduction functionalities, and the exploitation of synchronisation phenomena.

The term 'bandgap' generally refers to a range of frequencies with no allowed oscillation modes. The term 'quasi-bandgap' generally refers to a range of frequencies, where at least certain modes of at least one polarisation and/or frequency are not allowed. The mechanical resonator devices are micro- and nanoscale devices that are typically fabricated using surface micro- and nano-fabrication techniques for pattern transfer and etching/micromachining. Directions are defined with respect to a typical wafer surface geometry, wherein the terms 'in-plane', 'horizontal', and 'lateral' refer to directions essentially parallel to the plane of a wafer/chip from which the devices are fabricated, whereas the terms 'out-of-plane' and 'vertical' refer to directions perpendicular to the wafer/chip plane, i.e. perpendicular to the horizontal/lateral directions. Cartesian coordinates as used herein are denoted x, y, and z, wherein x and y refer to coordinates in horizontal directions, and z refers to coordinates in vertical directions. As also detailed below, the devices thus comprise a planar substrate on which the resonator device is formed. The substrate suspends the fabricated resonator device. In particular, the substrate provides anchoring points to which the clamping structure is fixed. As also further detailed below, the fabrication involves common thin film fabrication techniques for the fabrication of micro- and nano-scale devices. Accordingly, the elastic material under tensile stress is advantageously a thin film material. The term "decay length" as used herein refers to an exponential decay over a length/distance within which the amplitude of an elastic wave propagating according to the wave vector $k_{PC}$ in the clamping structure has decayed to 1/e of the amplitude at a given location, e.g. at the clamping structure/resonator element interface decaying in a direction away from the resonator element and into the clamping structure. The decay length thus corresponds to $1/\text{Im}[k_{PC}]$. The decay length of evanescent penetration of elastic waves corresponding to the oscillation mode sustained by the resonator element into the clamping structure may be expressed in units of a wavelength of the elastic waves, wherein the wavelength is defined as $2\pi/\text{Re}[k_{PC}]$. As mentioned above, a useful decay length of the evanescent penetration may be in the range 0.1 to 20 times the wavelength of the elastic waves in the clamping structure. Advantageously, the decay length is between 1 and 10 times the wavelength of the elastic waves in the clamping structure. The decay length of evanescent penetration of elastic waves corresponding to the oscillation mode sustained by the resonator element into the clamping structure may also be expressed in units of a lattice constant characterizing a periodic pattern that brings about the phononic bandgap in the clamping structure. Advantageously, a decay length of evanescent elastic waves is in the range of 0.1 to 20 times the lattice constant of the periodic pattern defining the phononic band gap.

BRIEF DESCRIPTION OF THE FIGURES

In the following, an embodiment of the invention is discussed in detail by way of example with reference to the appended figures, which show in FIG. 1 Measured and simulated data related to device characterization:
  a) Micrograph of a silicon nitride membrane patterned with a phononic crystal structure (left) and measured out-of-plane displacement pattern of the fundamental localized mode (right), of a device with lattice constant a=160 µm;
  b) Simulation of the stress redistribution in a unit cell of the hexagonal honeycomb lattice (left) and the corresponding first Brillouin zone (right);
  c) Simulated band diagram of a unit cell (left) and measured Brownian motion in the central part of the device shown in (a). Localized modes A-E are color-coded (A-red, B-orange, C-yellow, D-green, E-blue), the peak around 1.5 MHz an injected for calibration of the displacement amplitude;
  d) Ring-down measurements of A (red/bottom) and E (blue/top) modes of two membrane resonators with a=346 µm.

Figure 3:
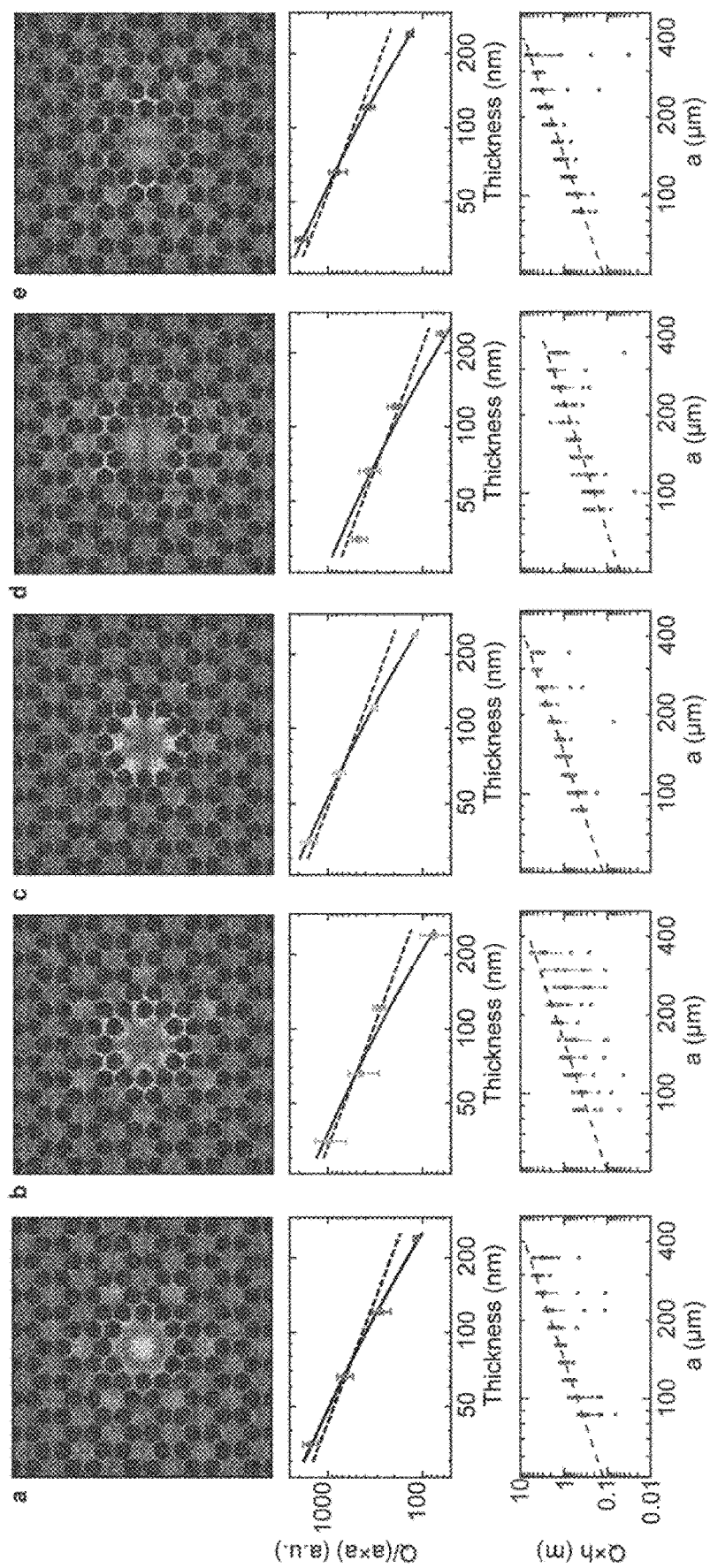
FIG. 3 Scaling of quality factors:
(a)-(e) Measured mode shapes of localised defect modes (top) with frequencies $f_A$, $f_B$, $f_C$, $f_D$, $f_E$=1.4627 MHz, 1.5667 MHz, 1.5697 MHz, 1.6397 MHz, 1.6432 MHz (for a device with a=160 µm), as well as characteristic scalings with the membrane thickness h (middle row) and lattice constant a (bottom row), when either are varied; Dashed grey lines in the middle row indicate a $Q/a^2 \propto h^{-1}$ scaling, while the solid black lines take into account the additional losses due to the bulk following eq. (5); Dashed grey line in bottom row indicates $Q \times h \propto a^2$ scaling; The semitransparent points correspond to the individual membranes, while the solid points (error bars) indicate their mean value (standard deviation)
Figure 5:
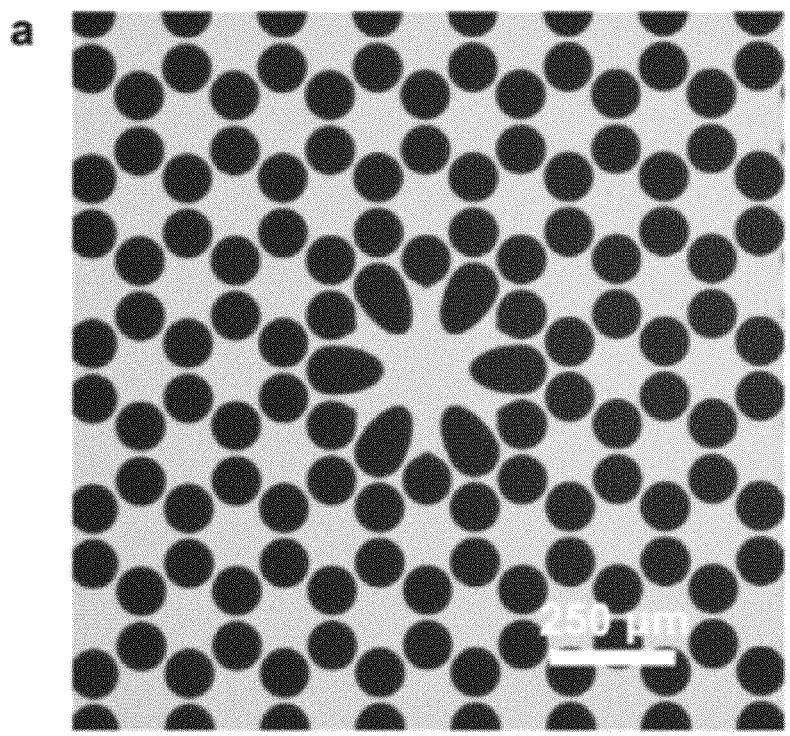
Figure 5:
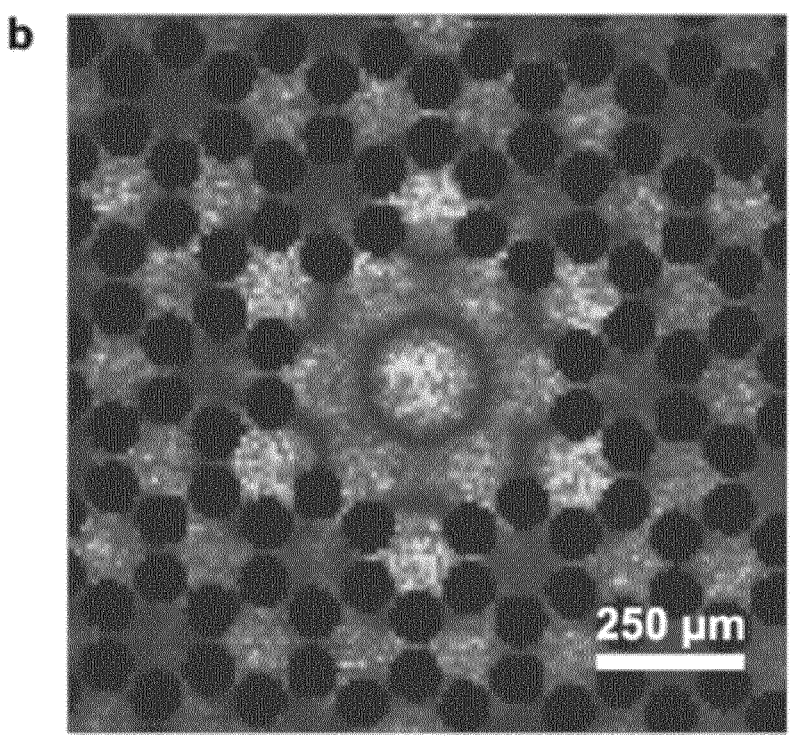
Figure 6:
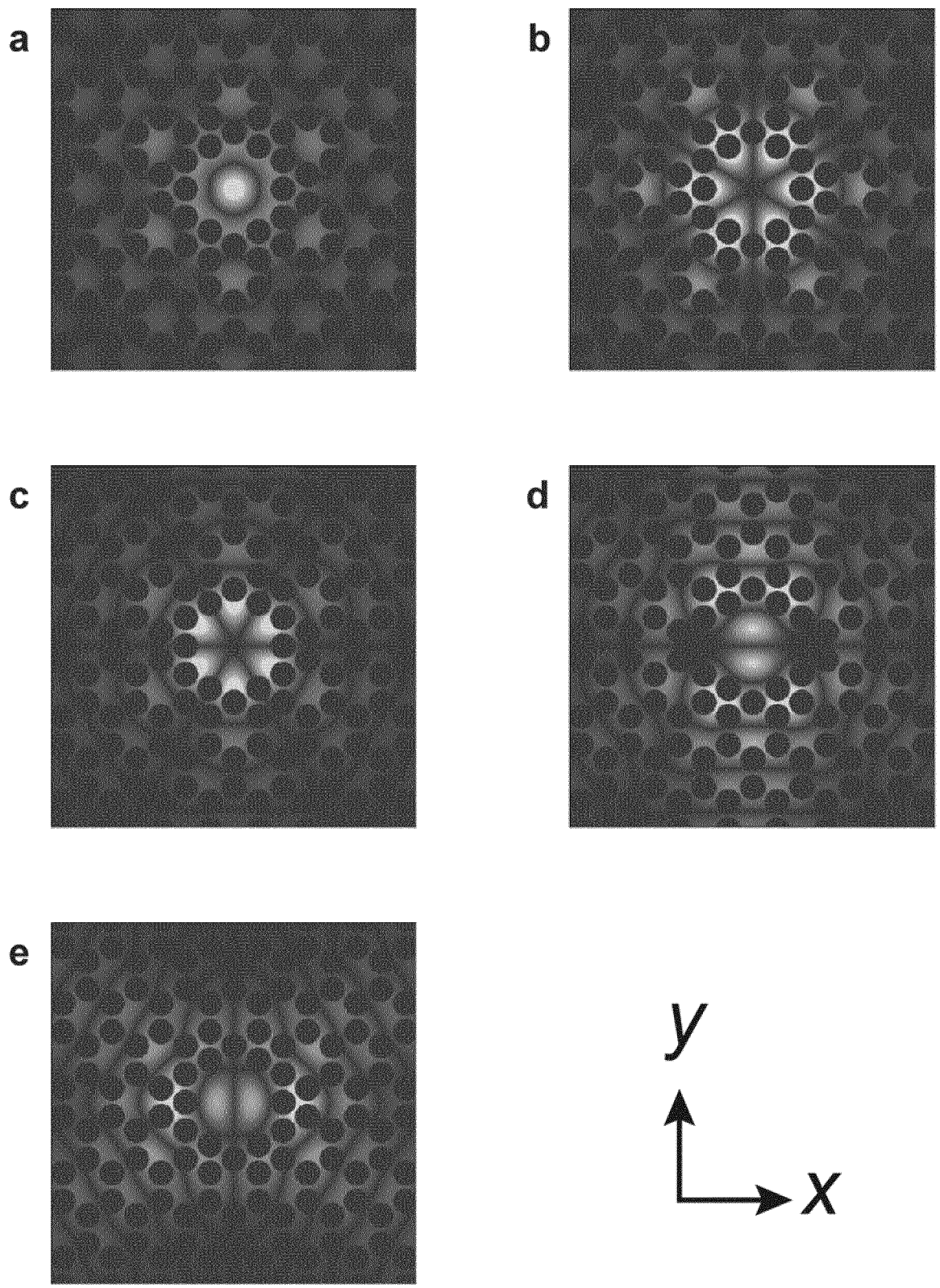
Figure 7:
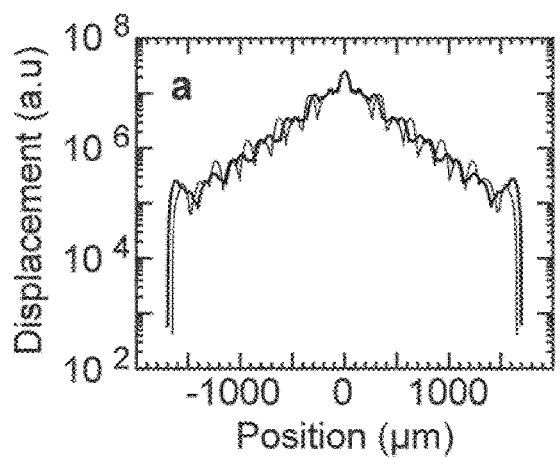
Figure 7:
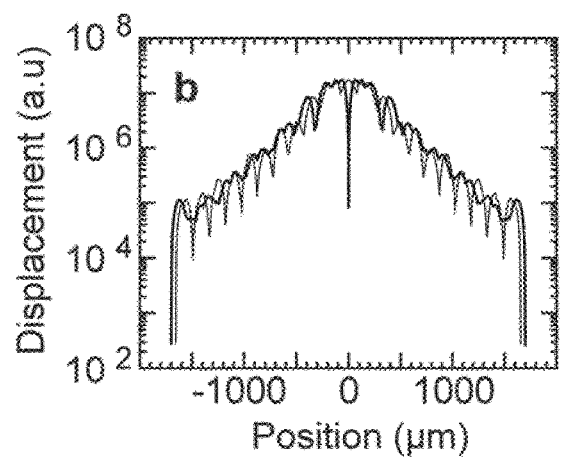
Figure 7:
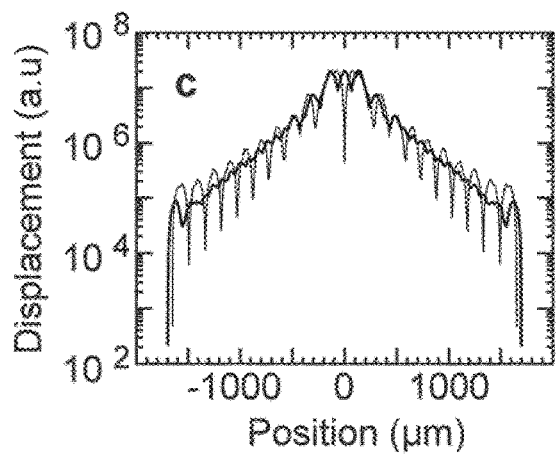
Figure 7:
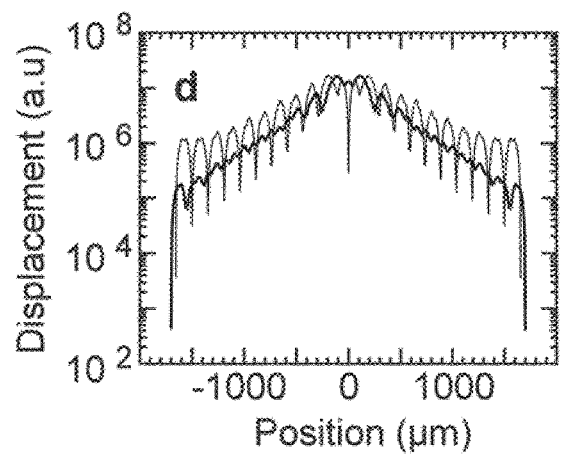
Figure 7:
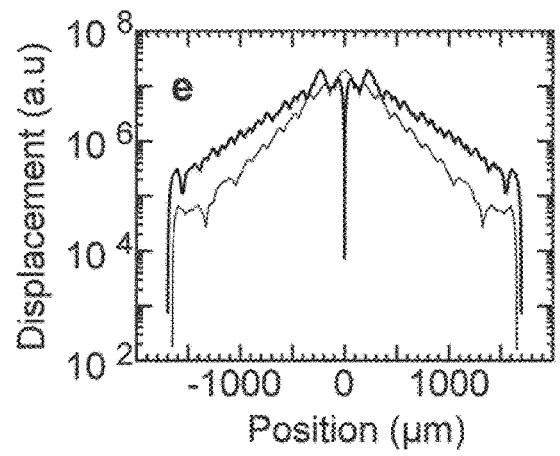

c) Simulated displacement along a vertical line through the defect (points); the curve labelled [red] is an exponential function as a guide to the eye, while the curve labelled [grey] represents a simplistic model of an exponentially decaying sinusoid as further detailed below;

d) Absolute value of mode curvature (blue line labelled soft) along the same section as c); Curvature is normalized to the square-root of the total stored energy in the resonator; Also shown, for comparison, is the normalized curvature of a square membrane with the same frequency (grey line labelled rigid); Inset is a zoom on the membrane clamp, revealing the exceedingly large curvature of a rigidly clamped membrane, and absent with soft clamping;

e) Compilation of measured (transparent markers and error bars, indicating standard deviations, colour coded according to FIG. 1c (A-red, B-orange, C-yellow, D-green, E-blue) and simulated (hollow circles) quality factors, normalized to $a^2/h$, consistent with the observed scaling with the corresponding quantities for h={35 nm; 66 nm; 121 nm};

FIG. 5 Alternative structures:

a) Micrograph of a trampoline-like resonator embedded in a phononic crystal membrane;

b) Measured higher-order localised mode of a large defect;

FIG. 6 Simulated displacement fields:

(a-e) Mode shapes of the localised vibrational modes A E of the defect, showing excellent agreement with the measurements in FIG. 3;

FIG. 7 Projections of the displacement fields:

(a-e) Projections of the simulated displacement fields along the x- (orange, thin solid line) and y-directions (red, thick solid line) for modes.

DETAILED DESCRIPTION

The following is a detailed discussion of an exemplary embodiment of the invention.

"Ultra-coherent nanomechanical resonators via soft clamping and dissipation dilution"

Abstract

Their small mass and high coherence render nanomechanical resonators the ultimate force probe, with applications ranging from bio-sensing and magnetic resonance force microscopy, to quantum opto-mechanics. A notorious challenge in these experiments is thermomechanical noise related to dissipation to internal or external loss channels. Here, we introduce a novel approach to defining nanomechanical modes, which simultaneously provides strong spatial confinement, full isolation from the substrate, and dilution of the resonator material's intrinsic dissipation by five orders of magnitude. It is based on a phononic bandgap structure that localizes the mode, without imposing the boundary conditions of a rigid clamp. The reduced curvature in the highly tensioned resonator enables $Q>10^8$ at 1 MHz, yielding the highest mechanical Qf-products ($>10^{14}$ Hz) yet reported at room temperature. The corresponding coherence times approach those of optically trapped dielectric particles. Extrapolation to 4.2 Kelvin predicts ~quanta/ms heating rates, similar to trapped ions.

Introduction

Nanomechanical resonators offer exquisite sensitivity in the measurement of mass and force. This has enabled dramatic progress in several frontier fields of contemporary physics, such as the detection of individual biomolecules [1], spins [2], and mechanical measurements of quantum vacuum fields [3]. Essentially, this capability originates from the combination of two features: first, a low mass in, so that small external perturbations induce relatively large changes in the motional dynamics. Second, high coherence, quantified by the quality factor Q, implying that random fluctuations masking the effect of the perturbation are small. In practice, a heuristic $Q \propto M^{1/3}$ rule, likely linked to surface losses [4], often forces a compromise, however.

A notable exception to this rule has been reported recently, in the form of highly stressed silicon nitride string [5] and membrane [6] resonators, achieving $Q \sim 10^6$ at MHz-resonance frequencies f, and nanogram (ng) effective masses $m_{eff}$. By now it is understood [7, 8, 9] that the pre-stress $\bar{\sigma}$ "dilutes" the dissipation intrinsic to the material (or its surfaces), a feat known and applied also in the mirror suspensions of gravitational wave antennae [10]. The resulting exceptional coherence has enabled several landmark demonstrations of quantum effects with nanomechanical resonators [11, 12, 13, 14, 15] already at moderate cryogenic temperatures.

Systematic investigations [16] of such silicon nitride resonators have identified an upper limit for the product $Q \cdot f < 6 \times 10^{12}$ Hz$\approx k_R T_R/(2\pi\hbar)$ for the low-mass fundamental modes, insufficient for quantum experiments at room temperature $T_R$. Better Qf-products have been reported in high-order modes of large resonators, but come at the price of significantly increased mass and intractably dense mode spectrum [17, 18]. Consequently, the revived development of so-called trampoline resonators [19] has received much attention recently [20, 21]. In these devices, four thin, highly tensioned strings suspend a small, light ($m_{eff}$~ng) central pad. The fundamental oscillation mode of the pad can (marginally) achieve $Q \cdot f \approx 6 \times 10^{12}$ Hz, provided that radiation losses at the strings' clamping points are reduced through a mismatched, i.e. very thick, silicon substrate [21].

In this work, we choose a different approach based on phononic engineering [22]. Our approach not only suppresses radiation to the substrate [23] strongly, it also enhances dissipation dilution dramatically. This is because it allows the mode to penetrate, evanescently, into the "soft" clamping region, which exhibits a phononic bandgap around the mode frequency. This strongly reduces the mode's curvature, whose large value close to a rigid clamp usually dominates dissipation if radiation loss is absent [10, 7, 8, 9].

As a result, we obtain Qf-products exceeding $10^{14}$ Hz at MHz frequencies, combined with rig-masses—an ideal combination for quantum opto-mechanics experiments. Remarkably, to the best of our knowledge, this is the highest room-temperature Qf-product of any mechanical resonator fabricated to date. This includes silicon MEMS devices and bulk quartz resonators, which are fundamentally limited to $Qf \leq 3 \times 10^{13}$ Hz by Akhiezer damping, but also LIGO's mirror suspensions [24, 25, 26, 27, 28].

Key Design Features

Figure 1:
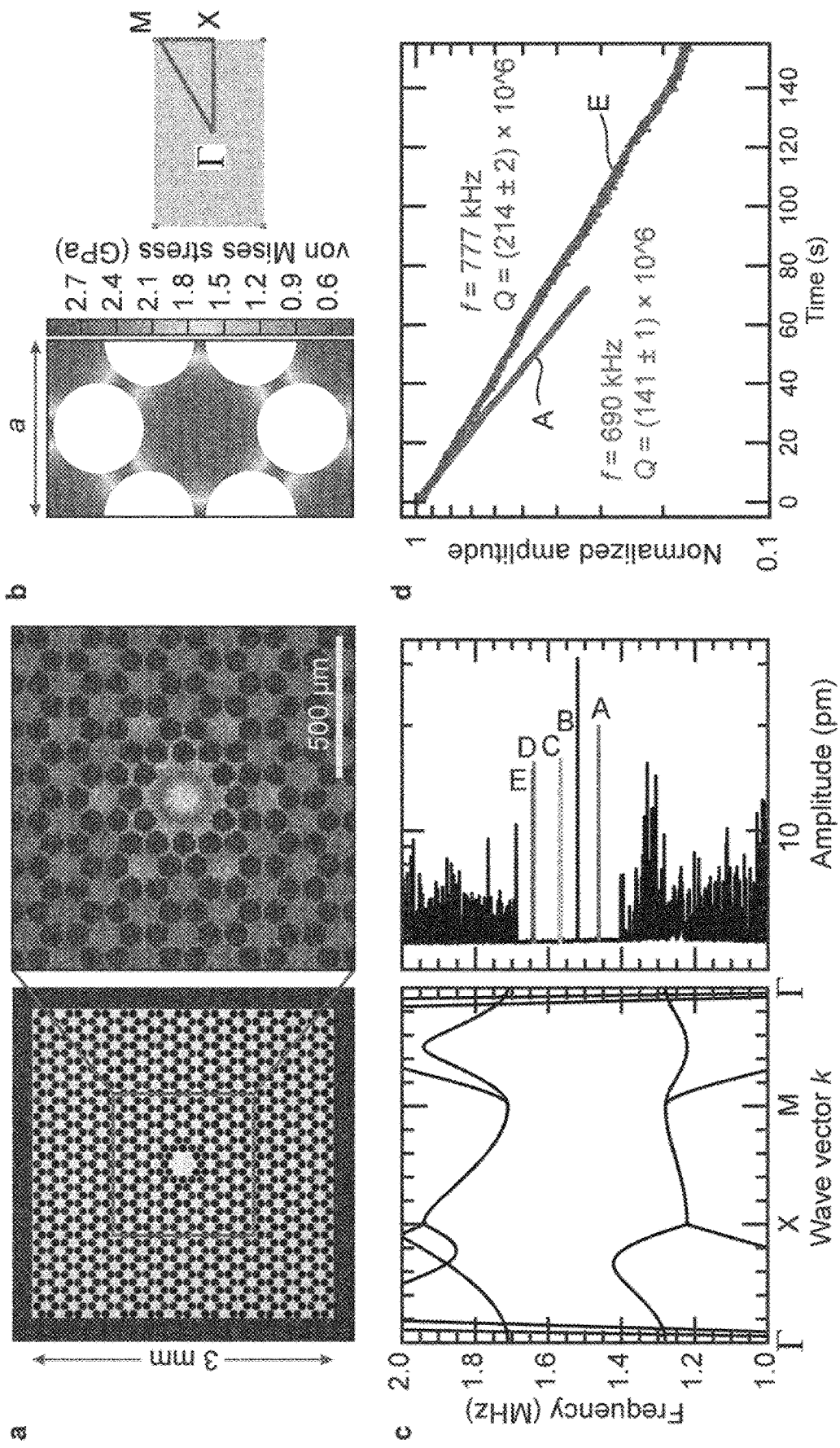

FIG. 1 shows the key characteristics of the devices fabricated following this new approach. A thin (thickness h=35 . . . 240 nm) silicon nitride film is deposited on a standard silicon wafer with a homogenous in-plane stress of $\sigma \approx 1.27$ GPa. The film is subsequently patterned with a honeycomb lattice (lattice constant a) of air holes over a ~(19×19.5)$a^2$ square region, where a=87 . . . 346 μm in the batch studied here. Back-etching the silicon substrate releases membranes of a few mm side length (Methods). Crucially, the lattice is perturbed by a small number of removed and displaced holes. They form a defect of characteristic dimension ~ a in the centre of the membrane, to which the mechanical modes of interest are confined.

In contrast to earlier opto-mechanical devices featuring phononic bandgaps [29, 30, 31, 15], a full bandgap is not expected [32] here, due to the extreme ratio $h/a \lesssim 10^{-3}$. A quasi-bandgap can nonetheless be opened [33, 34], whereby only in-plane modes with high phase velocity persist in the gap (FIG. 1c). Under high tensile stress, a honeycomb lattice achieves a relatively large bandgap—about 20% of the centre frequency 251 m/s·$\alpha^{-1}$—with a hole radius r=0.26a. At the same time, the design allows straightforward definition via photolithography, given that the tether width is still above 5 µm even for the smallest a. Evidently, the phonon dispersion is altered dramatically by the in-plane (d. c.) stress, which relaxes to an anisotropic and inhomogeneous equilibrium distribution that must be simulated (FIG. 1b) or measured [35] beforehand.

We characterise the membranes' out-of-plane displacements using a home-built laser interferometer, whose sampling spot can be raster-scanned over the membrane surface (Methods and [36]). FIG. 1b shows the displacement spectrum obtained when averaging the measurements obtained in a raster scan over a (1210 µm)²-square inside the defect, while the (a=160 µm) membrane is only thermally excited. The spectral region outside ~1.41 . . . 1.68 MHz is characterised by a plethora of unresolved peaks, which can be attributed to modes delocalised over then entire membrane. In stark contrast, within this spectral region, only a few individual mode peaks are observed, a direct evidence for the existence of a bandgap. Its spectral location furthermore agrees with simulations to within 2%. Extracting the amplitude of a few spectral bins around the first peak effectively tunes the interferometer to this mode, and allows mapping out its (r. m. s.) displacement pattern when raster-scanning the probe. FIG. 1a shows an image constructed in this way, zooming on the defect region. The pattern resembles a fundamental mode of the defect, with no azimuthal nodal lines, and its first radial node close to the first ring of holes defining the defect. Its eigenfrequency is $f_A \approx 235$ mls·a$^{-1}$. Outside the defect, the displacement follows the hexagonal lattice symmetry, but decays quickly with increasing distance to the centre. This is expected due to the forbidden wave propagation in the phononic bandgap, and leads to a strong localisation of the mode to the defect.

Ultrahigh Quality Factors

To assess the mechanical quality of the mode, we subject the defect to a second "excitation" laser beam, whose amplitude is modulated with the resonance frequency of the mode. Instead of a spatial scan, we now continuously monitor the defect's motion at the mode frequency, by lock-in detection of the interferometer signal. When the excitation laser is abruptly turned off, we observe the ring-down of the mechanical mode (Methods). Under a sufficiently high vacuum (p≤10$^{-6}$ mbar) but room temperature, it can last for several minutes at MHz frequencies. FIG. 1d shows an example of an "E"-mode with f=777 kHz and amplitude ringdown time 2τ=(87.7±0.8)s. This corresponds to Q=2πfτ=(214±2)×10$^6$ and Q·f=(1.66±0.02)×10$^{14}$ Hz.

Figure 2:
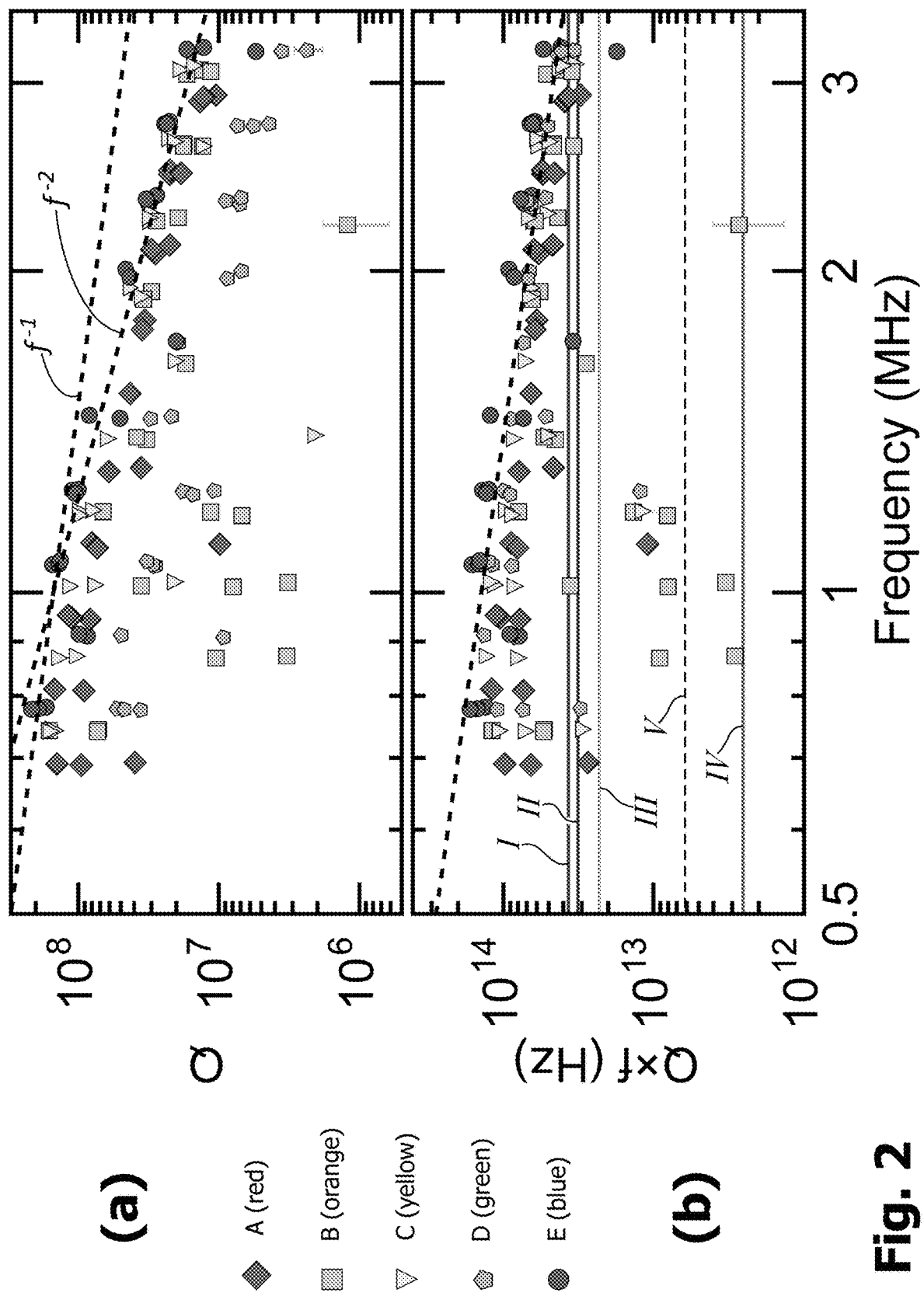
FIG. 2 Quality factor statistics:
a) Measured Q-factors of A-E defect modes in membranes of h=35 nm thickness and different size. Black (grey) dashed lines is a $Q \propto f^{-2}$ ($Q \propto f^4$) guide to the eye; Symbols (A-red diamond, B-orange square, C-yellow triangle, D-green pentagon, E-blue circle) indicate different localized defect modes corresponding to those shown in FIG. 1c;
b) Corresponding Q f-products; For reference, solid orange (I), red (II) and blue (III) lines indicate the quantum limit of crystalline silicon, quartz and diamond resonators, respectively [28]; Solid green line (IV) shows expected value for the fundamental mode of a square membranes under σ=1 GPa stress (4), and dashed grey line (V) indicates Q f=6×10$^{12}$ Hz required for room-temperature quantum opto-mechanics and reached by trampoline resonators [21] at f≈0.2 MHz (not shown)

To corroborate and explain this result, we have embarked on a systematic study of more than 400 modes in devices of varying thickness and size (rescaling the entire pattern with a). FIG. 2 shows a compilation of quality factors and Qf-products measured in 5 different modes of ~20 devices with varying size a=87 . . . 346 µm but fixed thickness h=35 nm. Clearly, the Qf-products exceed those of trampoline resonators by more than an order of magnitude, reaching deeply into the region of Q·f>6×10$^{12}$ Hz. It also consistently violates the "quantum" (Akhiezer) damping limit of crystalline silicon, quartz and diamond at room temperature, which fundamentally precludes mechanical resonators made from these materials from reaching beyond Qf~3×10$^{13}$ Hz [24, 25, 26, 28].

Our data, in contrast, do not seem to be limited by Akhiezer damping. Indeed a crude estimate following [28] indicates $Q_{Akh}f \sim \mathcal{O}(10^{15}$ Hz) for silicon nitride. Furthermore, since the relaxation times are much faster than the mechanical oscillation period, we would expect constant Qf, rather than the Q∝f$^{-2}$ trend discernible in our data. Thermoelastic damping, another notorious dissipation mechanism in micro- and nanomechanical resonators [37], has previously been estimated [6, 18] to allow Q>10$^{11}$ at ~1 MHz in highly stressed SiN resonators, and is therefore disregarded.

In absence of radiation loss [23]—an assumption we discuss below—stressed membrane resonators are usually limited by internal dissipation. Its microscopic nature is not known, but evidence is accumulating that it is caused by two-level systems [38, 39] located predominantly in a surface layer [16]. Their effect is well captured by a Zener model [7, 8, 9], in which the oscillating strain ($\tilde{\epsilon}(t)$ Re[$\tilde{\epsilon}_0 e^{i2\pi ft}$]) and stress $\tilde{\sigma}(t)$=Re[$\tilde{\sigma}_0 e^{i2\pi ft}$]) fields acquire a phase lag, $\tilde{\sigma}_0 = E\tilde{\epsilon}_0$, from a complex-valued Young's modulus E=E$_1$+iE$_2$. Per oscillation cycle, mechanical work amounting to $\Delta w = \oint \tilde{\sigma}(t)\dot{\tilde{\epsilon}}(t)dt = \pi E_2 |\tilde{\epsilon}_0|^2$ is done in each dissipating volume element. Integrating up the contributions yields the loss per cycle $\Delta W = \int \Delta w \, dV$. The comparison with the mode's total energy W determines its quality factor via $$Q^{-1} = \frac{\Delta W}{2\pi W} \qquad (1)$$

In highly stressed strings and membranes, W is dominated by the large pre-stress $\bar{\sigma}$, counteracting the membrane's elongation. In contrast, for small amplitudes, the oscillating strain and thus per-cycle loss is dominated by pure bending. As a result, W and ΔW in eq. (1) depend on different parts of the strain tensor $\tilde{\epsilon}_0 = \tilde{\epsilon}_0^{along} + \tilde{\epsilon}_0^{bend}$ associated with the mode's displacement profile. For pure out-of-plane displacement u(x, y) of a clamped membrane, this translates into the imperative to minimise bending-related loss $$\Delta W \approx \int \frac{\pi E_2}{1-\nu^2} z^2 \left(\frac{\partial^2 u}{\partial x^2} + \frac{\partial^2 u}{\partial y^2}\right)^2 dV \qquad (2)$$

over the tensile energy $$W \approx \int \frac{\sigma}{2}\left(\left(\frac{\partial u}{\partial x}\right)^2 + \left(\frac{\partial u}{\partial y}\right)^2\right) dV. \qquad (3)$$

For the fundamental mode of a plain square membrane of size L, this analysis predicts $$Q_\square^{-1} = (2\lambda + 2\pi^2\lambda^2)Q_{int}^{-1} \approx 2\lambda Q_{int}^{-1}, \qquad (4)$$

in very good agreement with available data [9, 16]. Here, $\lambda = \sqrt{E_1/(12\bar{\sigma})}\,h/L$ quantifies the "dilution" of the intrinsic dissipation $Q_{int}^{-1} \equiv E_2/E_1$ by the large internal stress $\bar{\sigma}$. That is, λ≪1, given the extreme aspect ratio h/L~$\mathcal{O}(10^{-4})$ and the Young's modulus E$_1$=270 GPa and pre-stress $\bar{\sigma}$=1.27 GPa. In an extension of this model [16], extra loss in a δh-thick surface layer $E_2(z)=E_2^{Vol}+E_2^{Surf}\theta(|z|-(h/2-\delta h))$ can be mapped on a thickness dependent $$Q_{int}^{-1}(h)=Q_{int,Vol}^{-1}+(\beta h)^{-1}. \quad (5)$$

$\beta=E_1/(6\delta h E_2^{Surf})$. If the latter dominates, it yields a total scaling $Q_\Box^{-1}\propto h^0/L^1$ with the geometry of the device. Our devices, however, follow a rather different scaling (FIG. 3), even though they are embedded in square membranes.

In this context, it is important to understand the origin of the two terms in eq. (4): the first, dominating term is associated with bending in the clamping region, while the second arises from the sinusoidal mode shape in the centre of the membrane [9]. The former is necessary to match this sinusoidal shape with the boundary conditions $u(\vec{r}_{cl})=(\vec{n}_{cl}\cdot\vec{\nabla})u(\vec{r}_{cl})=0$, where $\tilde{r}_{cl}=(x_{cl}, y_{cl})$ are points on, and $\vec{n}_{cl}$ the corresponding normal vectors to, the membrane boundary. It requires, in particular, that the membrane lie parallel to the substrate directly at the clamp, before it bends upwards supporting the sinusoidal shape in the centre. The extent, and integrated curvature of this clamping region is determined by its bending rigidity.

The boundary conditions differ dramatically in our case, $$u_d(\vec{r}_{cl})-u_{pc}(\vec{r}_{cl})=0$$

$$(\vec{n}_{cl}\cdot\vec{\nabla})(u_d(\vec{r}_{cl})-u_{pc}(\vec{r}_{cl}))=0, \quad (6,7)$$

requiring only the matching of the defect mode $u_d$ with the mode in the patterned part $u_{pc}$. If the phononic crystal clamp supports evanescent waves of complex wavenumber $k_{pc}$, it stands to reason that this "soft" clamping can be matched to a sinusoidal mode of the defect, characterised by a wavenumber $k_d\approx\text{Re}(k_{pc})\gg|\text{Im}(k_{pc})|$ without requiring significant extra bending. This eliminates the first term in eq. (4), leaving only the dramatically reduced dissipation $$Q^{-1}=\eta\frac{E}{\sigma}\frac{h^2}{a^2}Q_{int}^{-1}(h), \quad (8)$$

dominated by the sinusoidal curvature in the defect (and evanescent displacement fields) $\propto k_d^2\propto 1/a^2$, whereby the numerical pre-factor $\eta$ depends on the exact mode shape. In the surface damping (thin-membrane) limit, we have again $Q_{int}^{-1}(h)\approx(\beta h)^{-1}$ and obtain the overall scaling $Q\propto a^2/h$. This is indeed the scaling we observe over a wide range of parameters, in all five defect modes, supporting our argumentation (FIG. 3). For the largest thickness, slightly better agreement is found assuming contributions from bulk loss (5), in agreement with expectations.

Simulations

Finite element simulations (Methods) further support the hypothesis of coherence enhancement by soft clamping. As in the simulations of the band diagrams of FIG. 1, all modelling was performed in a two-step process, solving first for the new d.c. stress distribution compliant with the boundary conditions introduced by patterning. Subsequently the eigenmodes and -frequencies were determined. Only five modes with substantial out-of-plane displacements are found in the bandgap. Their displacement patterns match the measured ones excellently, and the measured and simulated frequencies agree to within 2%.

Figure 4:
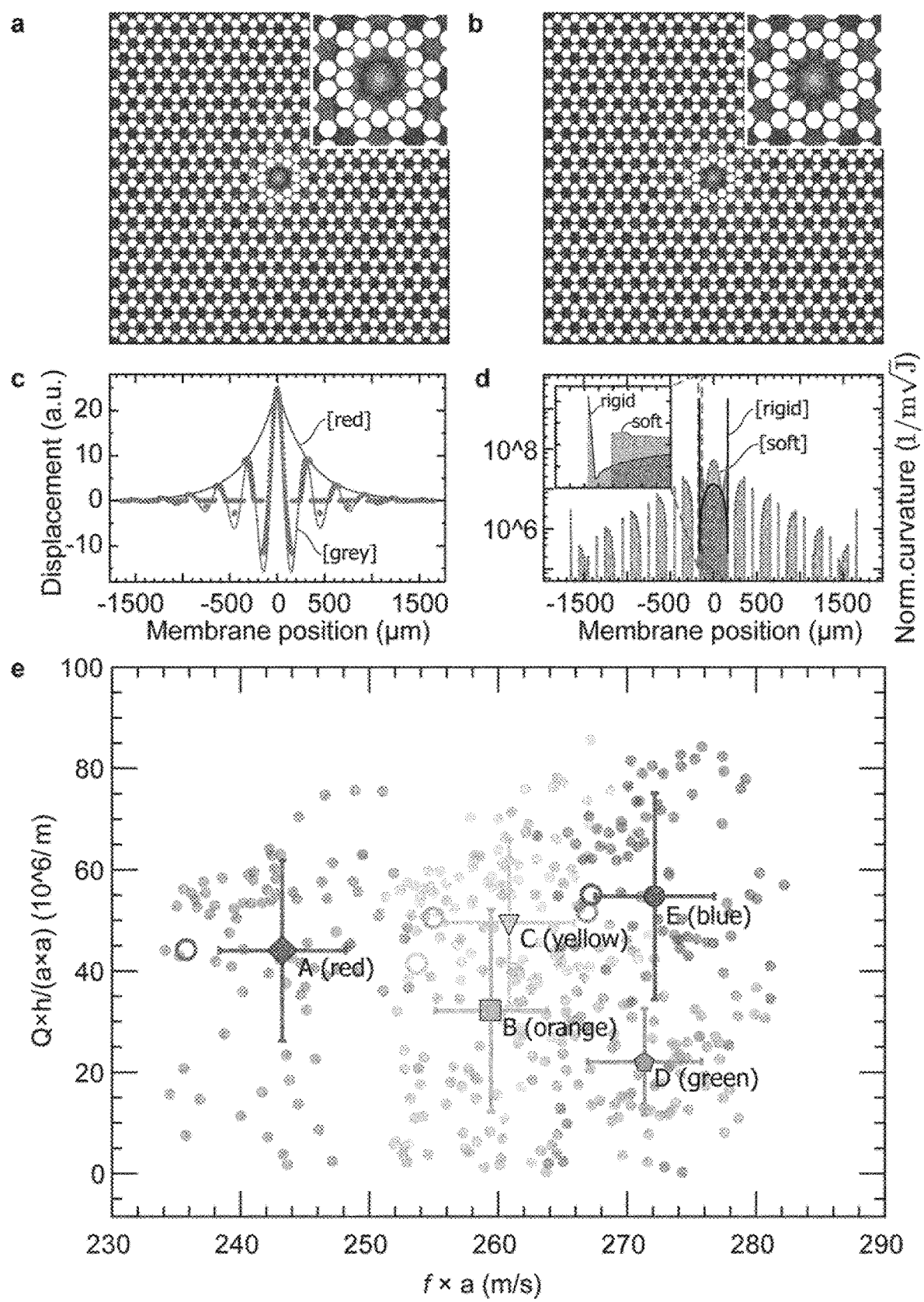
FIG. 4 Enhancing dissipation dilution:
a) Simulated displacement field of the fundamental mode and zoom on the defect (inset);
b) Absolute value of mode curvature and zoom on the defect (inset)

FIG. 4 shows the simulated displacement pattern of mode A, reproducing the measured mode pattern. It features strong localisation to the defect and a short, evanescent wave tail in the phononic crystal clamp. Already a simplistic model $u(0,y)\propto\text{Re}[\exp(ik_{pc}|x|)]$, with $k_{pc}, 2\pi(0.57+i0.085)/a$ reproduces a cross-sectional cut remarkably well (FIG. 4), supporting the scaling of curvature, and thus damping $\propto 1/a^2$. Note that more accurate modelling of the Bloch waves, their complex dispersion, and interaction with the defect [40, 33], is possible, but, in general, has to take bending rigidity into account to obtain the correct mode shape and curvature.

With the full simulated displacements at hand, we are in a position to evaluate the bending energy (2) and the total stored energy (3) for a prediction of the quality factor (1). For computational efficiency, we use the maximum kinetic energy $W_{kin}^{max}=(2\pi f)^2\int\rho u(x,y)^2\,dV/2=W$, equivalent to the stored energy (3) ($\rho=3200$ kg/m$^3$ is the density of SiN). A comparison of the normalised curvature $|(\partial_x^2+\partial_y^2)u(x,y)|/\sqrt{W}$ reveals the advantage of phononic crystal clamping over the fundamental mode of a square membrane: the latter exhibits a 2-order of magnitude larger curvature in the clamping region (FIG. 4). The somewhat larger integration domain of the phononic crystal membrane does not overcompensate this. Indeed, carrying out the integrals leads to quality factors in very good agreement with our measured values, much higher than the square membranes'. FIG. 4 shows the normalised quality factor $Q\times h/a^2$ for the five defect modes of more than 30 samples, assuming $Q_{int}$ (h=66 nm)=3750 [16]. Not only are the observed extreme quality factors consistent with simulations, the latter also confirm the trend for the highest Q's to occur in mode E, apparent (albeit not very significant) in the measurements.

Not all the modes' measured features are in quantitative agreement with the simulations. Small (<2%) deviations in the resonance frequency are likely due to small disagreements between the simulated and fabricated devices' geometry and material parameters, and deemed unproblematic for the purpose of this study. It is remarkable, however, that mode D exhibits significantly lower measured quality factors than simulated. We attribute this to the insufficient suppression of the mode amplitude at the silicon frame, leading to residual radiation losses. Indeed we observe in simulations that mode D has the largest amplitude at the silicon frame, and the fact that mode D responds most sensitively to the clamping conditions of the sample (SI).

Applications in Optomechanics and Sensing

The ultrahigh quality factors enabled by soft clamping enable the creation of mechanical devices with unique advantages for experiments in quantum optomechanics, and mass and force sensing. In quantum opto-mechanics [3], the presence of a thermal reservoir (temperature T) has the often undesired effect that it leads to decoherence of a low-entropy mechanical quantum state: for example, a phonon from the environment excites the mechanical device out of the quantum ground state. This decoherence occurs at a rate $$\gamma=\frac{k_B T}{\hbar Q}=1/\tau \quad (9)$$

and sets the timescale $\tau$ over which quantum-coherent evolution of mechanical resonators can be observed. It is a basic experimental requirement that this time exceeds the oscillation period, so that coherent evolution can be tracked over a number of $\sim 2\pi f\tau>1$ cycles. At room temperature T=300 K, this translates to $Q\cdot f>6\times 10^{12}$ Hz already discussed above. Our measured devices fulfil this condition with a significant margin.

The more challenging requirement typically is to optically measure and/or prepare the mechanical quantum state within the time τ. Since the measurement rate is proportional to the inverse effective mass $1/m_{\it eff}$, the latter constitutes another important figure of merit. For a device with a=160 μm, we have measured effective masses $m_{\it eff}$ of {4.3, 4.7, 4.2, 9.8, 7.2}·(1±0.11) ng for the five defect modes, which compare very favourably with $m_{\it eff,\square}$=4.9 ng of a square membrane with the same fundamental frequency f=1.46 MHz as mode A. Note that we have, in a recent experiment [15], realised optical measurements on similar square membranes at rates close to $\Gamma_{meas}$=2π×100 kHz, which exceeds γ of the new resonators already at room temperature. In principle, it is thus possible to ground-state cool, or entangle the novel mechanical resonators at room temperature. The limits in force and mass sensitivity due to thermomechanical noise are also improved by the devices' enhanced coherence and low mass, given the Langevin force noise power spectral density $$S_{FF} = 2m_{\it eff}\frac{2\pi f}{Q}k_B T. \quad (10)$$

The table below gives an overview of the figures of merit that ensue for the best device we have measured at room temperature. It shows key figures of merit of the E-mode in the best (a=320 μm) sample at room temperature, where all measurements were performed, and extrapolated to liquid helium temperature.

TABLE 1

| Temperature | T | 300 | 4.2 | K |
|---|---|---|---|---|
| Frequency | f | 777 | | kHz |
| Effective mass | $m_{\it eff}$ | 16 | | ng |
| Quality factor | Q | 214 | 535 | $10^6$ |
| fQ-product | f × Q | 166 | 416 | THz |
| Decoherence rate | γ/2π | 33000 | 175 | Hz |
| Coherence time | τ = 1/γ | 5 | 910 | μs |
| # coherent oscillations | 2πfτ | 23 | 4400 | 1 |
| Thermal force noise | $\sqrt{S_{FF}}$ | 55 | 4.1 | aN/√Hz |

It also includes an extrapolation of these parameters to liquid helium temperatures. Here we assumed a 2.5-fold reduction of intrinsic dissipation (5) upon cooling, a factor consistently observed in SiN films [30, 38]. Note that the expected decoherence rates are about one order of magnitude slower than those of optically trapped dielectric particles [41], and reach those achieved with trapped ions [42]. It combines with the low effective mass to thermomechanical force noise at the aN/√Hz-level, attractive for force sensing and -microscopy, such as magnetic resonance force microscopy (MRFM) of electron and nuclear spins [2, 43], as well as mass detection [44].

Efficient optical and electronic readout techniques are readily available [45, 38], facilitating also applications beyond cavity optomechanics. Further, due to the relatively high mode frequencies, 1/f-type noise, and technical noise such as laser phase noise, is less relevant. On a different note, due to the relatively low density of holes, it can be expected that the heat conductivity (provided by unaffected high-frequency phonons) is higher than that of trampoline resonators, an advantage in particular in cryogenic environments, and a fundamental difference to dielectric particles trapped in ultrahigh vacuum. Finally, the sparse spectrum of well-defined defect modes provides an ideal platform for multimode quantum opto-mechanics [15], or may be harnessed for multimode sensing, e.g. for mass imaging [46].

Outlook

Clearly, the devices we have discussed above are just specific examples of soft clamping, and many other designs are possible. Engineering of defect shape and size will modify its mode spectrum, mass, and dilution properties, and it is evident that our design can be further optimised, depending on the application. For example, larger defects will exhibit a richer multi-mode structure, of interest for multimode optomechanics and mass moment imaging [15, 46]. Small, trampoline-like defects have a potential to further reduce mass, as desired for force sensing. To illustrate this point, FIG. 5 shows two other examples we have realised in our laboratory, and verified to possess a phononic bandgap enhancing dissipation dilution. Similarly, the phononic crystal clamp can be engineered for stronger confinement, optimised dilution, and/or directional transport. Exploiting these new opportunities, it will be interesting to apply our soft-clamping approach to truly one-dimensional resonators [34], and to explore networks and arrays of defects with ultra-coherent modes with defined couplings.

In summary, we have introduced a novel type of mechanical resonator, which combines soft clamping and dissipation dilution. Its extremely weak coupling to any thermal reservoir can, on one hand, be harnessed to relax cooling requirements, and thus allow more complex experiments with long-coherence mechanical devices. On the other hand, if combined with cryogenic cooling, it enables ultraslow decoherence, which can be overwhelmed even by very weak coherent couplings to other physical degrees of freedom. A wide range of scientific and technical fields can thus benefit from this new development, including, but not limited to cavity opto-mechanics [3, 15], MRFM [2, 43], mass sensing and imaging [44, 46], and hybrid quantum systems [47, 48, 49].

Methods

A) Fabrication

The membrane resonators are fabricated by depositing stoichiometric silicon nitride ($Si_3N_4$) via low-pressure chemical vapor deposition (LPCVD) onto a double-side polished 500 μm single-crystal silicon wafer. A 1.5 μm layer of positive photoresist (AZ MiR 701) is spin-coated on both sides of the wafer and patterns are transferred onto both sides of the wafer via UV illumination, corresponding to the phononic crystal patterns on one side and rectangular patterns on the other side of the wafer. The regions exposed to UV radiation are developed and the silicon nitride is etched in these regions using reactive ion etching. The photoresist is removed using acetone and oxygen plasma. In order to protect the phononic patterned side of the wafer during the potassium hydroxide (KOH) etch, we use a screw-tightened PEEK wafer holder, only allowing the KOH to attack the side with square patterns. Finally, after a 6-hour-etch the wafers are cleaned in a piranha solution, thus completing the fabrication process.

B) Characterisation

Optical measurements of the mechanical motion are performed with a Michelson interferometer at a wavelength of 1064 nm. We place a sample at the end of one interferometer arm and spatially overlap the reflected light with a strong local oscillator. The relative phase between the two beams is detected by a high-bandwidth (0-75 MHz) InGaAs balanced receiver and analysed with a spectrum analyser. In the local oscillator arm a mirror is mounted on a piezoelectric actuator that follows an electronic feedback from the slow monitoring outputs of the receiver, stabilizing the interferometer at the mid fringe position. Furthermore, the piezo generates a peak with a known voltage and frequency. By measuring the full fringe voltage, the power of this peak is converted into a displacement, which is then used to calibrate the spectrum. Using an incident probe power of ~1 mW the interferometer enables shot noise limited sensitivity of 10 fm/√Hz, To image mechanical modes the probe beam is focused down to a spot diameter of 2 µm and raster-scanned over the sample surface by means of a motorized 3-axis translation stage with a spatial resolution of 1.25 µm. At each position we extract the amplitude of a few spectral bins around a mechanical peak and thereby construct a 2D map of displacement. The effective masses of mode A-E are extracted from the maximum of the displacement maps after subtracting a background (~1 pm) and smoothing. Uncertainties in the mass are based on a 10% error of the above-mentioned displacement calibration. Quality factor measurements are performed by continuously monitoring the membrane motion at a fixed spot on the sample and optically exciting a given mechanical mode using a laser at a wavelength of 880 nm and incident power of 0.5-1 mW, which is amplitude modulated at the mode frequency using an acousto-optic modulator. We use a lock-in amplifier to analyse the driven motion and record mechanical ring-downs.

For our systematic study of >400 mechanical modes, we place a 4-inch wafer each with 40 membranes in a high vacuum chamber at a pressure of a few $10^{-7}$ mbar and gently clamp down the wafer at its rim. By measuring mechanical damping as a function of vacuum pressure we verify that modes with $Qf>10^{14}$ Hz are unaffected by viscous damping to within 10%.

C) Simulations

We use COMSOL Multiphysics to simulate the phononic patterned membrane resonators. The simulations are typically carried out in two steps. First, we perform a stationary study to calculate the stress redistribution due to perforation, assuming a homogeneous initial in-plane stress $\sigma_{xx}=\sigma_{yy}$. The redistributed stress is subsequently used in an eigenfrequency analysis, where we either calculate the eigenmodes of an infinite array for different wave vectors $\vec{k}$ in the first Brillouin zone, or simply simulate the eigenmodes of actual devices.

The mechanical quality factors are extracted by calculating the curvature of a given localized mode, which is obtained from an eigenfrequency simulation, as described above. In order to minimize numerical errors, the geometry is densely meshed. We ensure that increasing the number of mesh elements by a factor of 3 only results in 10% change in the integrated curvature.

REFERENCES

[1] J. L. Arlett, E. B. Myers, and M. L. Roukes. Comparative advantages of mechanical biosensors. *Nature Nanotechnology*, 6(4):203, March 2011.

[2] D. Rugar, R. Budakian, H. J. Mamin, and B. W. Chui. Single spin detection by magnetic resonance force microscopy. *Nature*, 430(6997):329, July 2004.

[3] M. Aspelmeyer, T. J. Kippenberg, and F. Marquardt. Cavity optomechanics. *Rev. Mod. Phys.*, 86(4):1391-1452, December 2014.

[4] K. L. Ekinci and M. L. Roukes. Nanoelectromechanical systems. *Review of Scientific Instruments*, 76:061101, 2005.

[5] S. S. Verbridge, H. G. Craighead, and J. M. Parpia. A megahertz nanomechanical resonator with room temperature quality factor over a million. *Applied Physics Letters*, 92:013112, 2008.

[6] B. M. Zwickl, W. E. Shanks, A. M. Jayich, C. Yang, C. Bleszynski Jayich, J. D. Thomson, and J. G. E. Harris. High quality mechanical and optical properties of commercial silicon nitride membranes. *Applied Physics Letters*, 92:103125, 2008.

[7] Q. P. Unterreithmeier, T. Faust, and J. P. Kotthaus. Damping of nanomechanical resonators. *Physical Review Letters*, 105:027205, July 2010.

[8] S. Schmid, K. D. Jensen, K. H. Nielsen, and A. Boisen. Damping mechanisms in high-Q micro and nanomechanical string resonators. *Physical Review B*, 84(16):165307, October 2011.

[9] P.-L. Yu, T. P. Purdy, and C. A. Regal. Control of material damping in high-q membrane microresonators. *Physical Review Letters*, 108:083603, 2012.

[10] G. I. González and P. R. Saulson. Brownian motion of a mass suspended by an anelastic wire. *Journal of the Acoustical Society of America*, 96:207-212, 1994.

[11] J. D. Thompson, B. M. Zwickl, A. M. Jayich, F. Marquardt, S. M. Girvin, and J. G. E. Harris. Strong dispersive coupling of a high finesse cavity to a micromechanical membrane. *Nature*, 452:72-75, 2008.

[12] T. P. Purdy, R. W. Peterson, and C. A. Regal. Observation of radiation pressure shot noise on a macroscopic object. *Science*, 339:801-804, 2013.

[13] T. P. Purdy, P.-L. Yu, R. W. Peterson, N. S. Kampel, and C. A. Regal. Strong optomechanical squeezing of light. *Physical Review X*, 3(3):031012, September 2013.

[14] D. J. Wilson, V. Sudhir, N. Piro, R. Schilling, A. Ghadimi, and T. J. Kippenberg. Measurement-based control of a mechanical oscillator at its thermal decoherence rate. *Nature*, 524(7565):325-329, August 2015.

[15] W. H. P. Nielsen, Y. Tsaturyan, C. B. Møller, E. S. Polzik, and A. Schliesser. Multimode optomechanical system in the quantum regime. *arXiv*:1605.06541, 2016.

[16] L. G. Villanueva and S. Schmid. Evidence of surface loss as ubiquitous limiting damping mechanism in sin micro- and nanomechanical resonators. *Physical Review Letters*, 113(22):227201, November 2014.

[17] D. J. Wilson, C. A. Regal, S. B. Papp, and H. J. Kimble. Cavity optomechanics with stoichiometric SiN films. *Physical Review Letters*, 103:207204, 2009.

[18] S. Chakram, Y. S. Patil, L. Chang, and M. Vengalattore. Dissipation in ultrahigh quality factor SiN membrane resonators. *Physical Review Letters*, 112:127201, 2014.

[19] D. Kleckner, B. Pepper, E. Jeffrey, P. Sonin, S. M. Thon, and D. Bouwmeester. Optomechanical trampoline resonators. *Optics Express*, 19(20):19708, September 2011.

[20] C. Reinhardt, T. Müller, A. Bourassa, and J. C. Sankey. Ultralow-noise sin trampoline resonators for sensing and optomechanics. *Physical Review X*, 6(2):021001, April 2016.

[21] R. Norte, J. P. Moura, and S. Gröblacher. Mechanical resonators for quantum optomechanics experiments at room temperature. *Physical Review Letters*, 116(14): 147202, April 2016.

[22] M. Maldovan. Sound and heat revolutions in phononics. *Nature*, 503(7475):209, November 2013.

[23] I. Wilson-Rae. Intrinsic dissipation in nanomechanical resonators due to phonon tunneling. *Physical Review B*, 77:245418, 2008.

[24] V. B. Braginsky, V. P. Mitrofanov, and V. I. Panov. *Systems with small dissipation*. University of Chicago Press, 1985.

[25] A. Ballato and J. G. Gualtieri. Advances in high-Q piezoelectric resonator materials and devices. *IEEE*

Transactions on Ultrasonics, Ferroelectrics and Frequency Control, 41:834, 1994.

[26] J. E.-Y. Lee and A. A. Seshia. 5.4-MHz single-crystal silicon wine glass mode disk resonator with quality factor of 2 million. *Sensors and Actuators A: Physical,* 156(1):28, November 2009.

[27] A. V. Cumming, A. S. Bell, L. Barsotti, M. A. Barton, G. Cagnoli, D. Cook, L. Cunningham, M. Evans, G. D. Hammond, G. M. Harry, A. Heptonstall, J. Hough, R. Jones, R. Kumar, R. Mittleman, N. A. Robertson, S. Rowan, B. Shapiro, K. A. Strain, K. Tokmakov, C. Torrie, and A. A. van Veggel. Design and development of the advanced ligo monolithic fused silica suspension. *Classical and Quantum Gravity,* 29(3):035003, January 2012.

[28] S. Ghaffari, S. A. Chandorkar, S. Wang, E. J. Ng, C. H. Ahn, V. Hong, Y. Yang, and T. W. Kenny. Quantum limit of quality factor in silicon micro and nano mechanical resonators. *Scientific Reports,* 3:1, November 2013.

[29] T. P. Mayer Alegre, A. Safavi-Naeini, M. Winger, and O. Painter. Quasi-two-dimensional optomechanical crystals with a complete phononic bandgap. *Optics Express,* 19:5658-5669, 2011.

[30] Y. Tsaturyan, A. Barg, A. Simonsen, L. G. Villanueva, S. Schmid, A. Schliesser, and E. S Polzik. Demonstration of suppressed phonon tunneling losses in phononic bandgap shielded membrane resonators for high-Q optomechanics. *Optics Express,* 6:6810, 2013.

[31] P.-L. Yu, K. Cicak, N. S. Kampel, Y. Tsaturyan, T. P. Purdy, R. W. Simmonds, and C. A. Regal. A phononic bandgap shield for high-Q membrane microresonators. *Applied Physics Letters,* 104:023510, 2014.

[32] S. Mohammadi, A. A. Eftekhar, A. Khelif, H. Moubchir, R. Westafer, W. D. Hunt, and A. Adibi. Complete phononic bandgaps and bandgap maps in two-dimensional silicon phononic crystal plates. *Electronics Letters,* 43(16):898, 2007.

[33] A. Z. Barasheed, T. Müller, and J. C. Sankey. Optically defined mechanical geometry. *Physical Review A,* 93:053811, 2016.

[34] A. H. Ghadimi, D. J. Wilson, and T. J. Kippenberg. Dissipation engineering of high-stress silicon nitride nanobeams. *arXiv:*1603.01605, 2016.

[35] T. Capelle, Y. Tsaturyan, A. Barg, and A. Schliesser. Polarimetric analysis of stress anisotropy in nanomechanical silicon nitride resonators. *in preparation,* 2016.

[36] A. Barg, W. Nielsen, Y. Tsaturyan, C. Møller, and A. Schliesser. Measuring and imaging nanomechanical motion with laser light. *in preparation,* 2016.

[37] R. Lifshitz and M. L. Roukes. Thermoelastic damping in micro- and nanomechanical systems. *Physical Review B,* 61:5600-5609, 2000.

[38] T. Faust, J. Rieger, M. J. Seitner, J. P. Kotthaus, and E. M. Weig. Signatures of two-level defects in the temperature-dependent damping of nanomechanical silicon nitride resonators. *Physical Review B,* 89:100102, 2014.

[39] M. Yuan, M. A. Cohen, and G. A. Steele. Silicon nitride membrane resonators at millikelvin temperatures with quality factors exceeding $10^8$. *Applied Physics Letters,* 107(26):263501, December 2015.

[40] V. Laude, Y. Achaoui, S. Benchabane, and A. Khelif. Evanescent bloch waves and the complex band structure of phononic crystals. *Physical Review B,* 80(9):092301, September 2009.

[41] V. Jain, J. Gieseler, C. Moritz, C. Dellago, R. Quidant, and L. Novotny. Direct measurement of photon recoil from a levitated nanoparticle. *Physical Review Letters,* 116(24):243601, June 2016.

[42] Q. A. Turchette, Kielpinski, B. E. King, D. Leibfried, D. M. Meekhof, C. J. Myatt, M. A. Rowe, C. A. Sackett, C. S. Wood, W. M. Itano, C. Monroe, and D. J. Wineland. Heating of trapped ions from the quantum ground state. *Physical Review A,* 61(6):063418, May 2000.

[43] M Poggio and C L Degen. Force-detected nuclear magnetic resonance: recent advances and future challenges. *Nanotechnology,* 21(34):342001, July 2010.

[44] M. S. Hanay, S. Kelber, A. K. Naik, D. Chi, S. Hentz, E. C. Bullard, E. Colinet, L. Duraffourg, and M. L. Roukes. Single-protein nanomechanical mass spectrometry in real time. *Nature Nanotechnology,* 7(9):602, August 2012.

[45] T. Bagci, A. Simonsen, S. Schmid, L. G. Villanueva, E. Zeuthen, J. Appel, J. M. Taylor, A. Sørensen, K. Usami, A. Schliesser, and E. S. Polzik. Optical detection of radio waves through a nanomechanical transducer. *Nature,* 507:81, 2014.

[46] M. S. Hanay, S. I. Kelber, C. D. O'Connell, P. Mulvaney, J. E. Sader, and M. L. Roukes. Inertial imaging with nanomechanical systems. *Nature Nanotechnology,* 10(4):339, March 2015.

[47] S. Kolkowitz, A. C. Bleszynski Jayich, Q. P. Unterreithmeier, S. D. Bennett, P. Rabl, J. G. E. Harris, and M. D. Lukin. Coherent sensing of a mechanical resonator with a single-spin qubit. *Science,* 335(6076):1600, March 2012.

[48] A. Jöckel, A. Faber, T. Kampschulte, M. Korppi, M. T. Rakher, and P. Treutlein. Sympathetic cooling of a membrane oscillator in a hybrid mechanical-atomic system. *Nature Nanotechnology,* 10(1):55, November 2014.

[49] G. Kurizki, P. Bertet, Y. Kubo, K. Molmer, D. Petrosyan, P. Rabl, and J. Schmiedmayer. Quantum technologies with hybrid systems. *Proceedings of the National Academy of Sciences,* 112:3866, March 2015.

The invention claimed is:

1. Mechanical resonator device, the resonator device comprising
    a resonator element made of an elastic material under tensile stress and adapted for sustaining at least one oscillation mode; and
    a clamping structure supporting the resonator element;
    wherein the clamping structure has a phononic density of states exhibiting a bandgap or quasi-bandgap such that elastic waves of at least one polarisation and/or frequency are not allowed to propagate through the clamping structure; and
    wherein the resonator element and the clamping structure are configured in a manner such that elastic waves of polarisation and/or frequency corresponding to the at least one oscillation mode of the resonator element penetrate evanescently into the clamping structure so as to provide a soft-clamping of the resonator element;
    wherein configuration of the resonator element and the clamping structure includes integral minimization of bending related loss over tensile energy over the entire resonator device.

2. Resonator device according to claim 1, wherein an energy-normalized mode shape curvature integral for said oscillation mode of the resonator device is less than an energy-normalized mode shape curvature integral for a corresponding mode with the same frequency of a reference resonator directly suspended from fixed anchoring means on a substrate.

3. Resonator device according to claim 1, wherein the bandgap or quasi-bandgap is produced in the clamping structure by a periodic pattern with lattice constant a.

4. Resonator device according to claim 1, wherein the resonator element and the clamping structure are made of the same elastic material under tensile stress.

5. Resonator device according to claim 1, wherein the resonator element and the clamping structure are formed in a membrane.

6. Resonator device according to claim 1, wherein the at least one oscillation mode of the resonator element is an out-of-plane oscillation mode.

7. Resonator device according to claim 1, wherein the elastic material under tensile stress is one of silicon nitride, diamond, quartz, aluminium nitride, silicon carbide, gallium arsenide, indium gallium arsenide, aluminium gallium arsenide, aluminium, gold, graphene, polymer materials, or combinations thereof.

8. Resonator device according to claim 1, wherein the elastic material under tensile stress is one of dielectrics, metals, semiconductors, metal dichalcogenides, ceramics or piezoelectric materials, or combinations thereof.

9. Resonator device according to claim 1, wherein an initial stress in the elastic material under tensile stress is between 10 MPa and 50 GPa.

10. Resonator device according to claim 1, wherein the resonator device comprises at least one further resonator element supported by the clamping structure, wherein
    each further resonator element is made of an elastic material under tensile stress and adapted for sustaining at least one respective further oscillation mode; and
    wherein each of the further resonator elements is configured with respect to the clamping structure in a manner such that elastic waves of polarisation and frequency corresponding to the at least one further oscillation mode of the at least one further resonator element penetrate evanescently into the clamping structure so as to provide a soft-clamping of the further resonator element.

11. Resonator device according to claim 10, wherein the resonator element, the at least one further resonator element, and the clamping structure are made of the same elastic material under tensile stress.

12. Resonator device according to claim 1, wherein a decay length of evanescent elastic waves is in the range of 0.1 to 20 times the wavelength of the elastic waves in the clamp.

13. Method of providing a mechanical resonator device, the resonator device comprising a resonator element and a clamping structure supporting the resonator element, the method comprising the steps of:
    determining at least one oscillator mode for the resonator element,
    determining a phononic density of states for the clamping structure, the phononic density of states exhibiting a bandgap or quasi-bandgap such that elastic waves of at least one polarisation and/or frequency are not allowed to propagate through the clamping structure; and
    matching the resonator element and the clamping structure in a manner such that elastic waves of polarisation and/or frequency corresponding to the at least one oscillation mode of the resonator penetrate evanescently into the clamping structure so as to provide a soft-clamping of the resonator element; wherein matching the resonator element and the clamping structure includes integrally minimizing bending related loss over tensile energy over the entire resonator device.

14. Method according to claim 13, wherein an energy-normalized mode shape curvature integral for said oscillation mode of the resonator device is less than an energy-normalized mode shape curvature integral for a corresponding mode with the same frequency of a reference resonator directly suspended from fixed anchoring means on a substrate.

15. Method according to claim 13, wherein matching the resonator element and the clamping structure includes determining a quality factor Q of the resonator device according to the equation:

$$Q^{-1} = \Delta W/(2\pi W),$$

wherein $\Delta W$ is the bending related loss per oscillation cycle of a given mode, and W is the total energy of the mode.

16. Method according to claim 15, wherein the given mode is an out-of-plane oscillation mode, wherein u(x,y) denotes out-of-plane displacement of the resonator device in a z-direction as a function of a lateral position denoted by lateral position coordinates x and y, and wherein the bending related loss per oscillation cycle $\Delta W$ is determined as:

$$\Delta W \approx \int \frac{\pi E_2}{1-v^2} z^2 \left(\frac{\partial^2 u}{\partial x^2} + \frac{\partial^2 u}{\partial y^2}\right)^2 dV,$$

wherein $E_2$ denotes a complex part of the Young's modulus, wherein v denotes a Poisson ratio, wherein dV denotes a volume element; and wherein the total energy W of the given mode is determined as the tensile energy:

$$W \approx \int \frac{\sigma}{2}\left(\left(\frac{\partial u}{\partial x}\right)^2 + \left(\frac{\partial u}{\partial y}\right)^2\right) dV,$$

wherein $\sigma$ denotes tensile pre-stress in the elastic material of the resonator device.

17. Sensor for the detection of mass and/or forces, the sensor comprising
    a resonator device, the resonator device comprising
    a resonator element made of an elastic material under tensile stress and adapted for sustaining at least one oscillation mode; and
    a clamping structure supporting the resonator element;
    wherein the clamping structure has a phononic density of states exhibiting a bandgap or quasi-bandgap such that elastic waves of at least one polarization and/or frequency are not allowed to propagate through the clamping structure; and
    wherein the resonator element and the clamping structure are configured in a manner such that elastic waves of polarization and/or frequency corresponding to the at least one oscillation mode of the resonator element penetrate evanescently into the clamping structure so as to provide a soft-clamping of the resonator element;
    the sensor further comprising
    a readout device adapted to sensing a displacement of the resonator element and provide a detection signal representative of the displacement, wherein the read-out device is configured for sensing an out-of-plane oscillation of the resonator element.

18. Sensor according to claim 17, wherein the read-out device uses an optical and/or electronic readout element for sensing displacement of the resonator element.

* * * * *